(12) United States Patent
Hong et al.

(10) Patent No.: US 8,593,616 B2
(45) Date of Patent: Nov. 26, 2013

(54) ACTUATOR, STAGE DEVICE, AND EXPOSURE APPARATUS

(75) Inventors: Sang Joon Hong, Suwon-si (KR); Sang Hyun Park, Yongin-si (KR); Sang Don Jang, Suwon-si (KR); Oui Serg Kim, Seongnam-si (KR); Ja Choon Koo, Seoul (KR); Yong Seok Ihn, Paju-si (KR); Jung Woong Jang, Ulsan (KR); Yoo Chang Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 477 days.

(21) Appl. No.: 12/926,473

(22) Filed: Nov. 19, 2010

(65) Prior Publication Data
US 2011/0134409 A1 Jun. 9, 2011

(30) Foreign Application Priority Data
Dec. 7, 2009 (KR) .......................... 10-2009-0120694

(51) Int. Cl.
*B23B 5/22* (2006.01)
*G03B 27/52* (2006.01)
*G03B 27/54* (2006.01)

(52) U.S. Cl.
USPC ............... 355/55; 279/2.1; 279/2.11; 355/67

(58) Field of Classification Search
CPC .................................................. G03F 7/70825
USPC .................... 74/89.28, 490.07; 279/2.1, 2.11; 355/67, 71, 72, 55; 359/811, 813, 814, 359/819, 822–824, 829
See application file for complete search history.

(56) References Cited

U.S. PATENT DOCUMENTS

2010/0128237 A1* 5/2010 Okamoto et al. ............... 355/55

* cited by examiner

*Primary Examiner* — Toan Ton
*Assistant Examiner* — Colin Kreutzer
(74) *Attorney, Agent, or Firm* — Harness, Dickey & Pierce, P.L.C.

(57) ABSTRACT

An actuator according to example embodiments may be relatively compact and may be driven with 2 degrees of freedom with less spatial constraints. The actuator may include a base member, a ball screw member including a ball screw coupled to the base member and a ball nut screwed onto the ball screw, a driving member coupled to the ball nut so as to move in conjunction with the ball nut, a first directional displacement member configured to move in a first direction in response to a first movement of the driving member, a wedge member coupled to the driving member so as to be moved in a second direction in response to a second movement of the driving member, a second directional displacement member configured to move in a second direction in conjunction with the wedge member, and a binding member configured to bind the first directional displacement member to at least one of the driving member, the wedge member, and the base member.

18 Claims, 10 Drawing Sheets

ACTUATOR, STAGE DEVICE, AND EXPOSURE APPARATUS

CROSS-REFERENCE TO RELATED APPLICATION

This application claims priority under 35 U.S.C. §119 to Korean Patent Application No. 10-2009-0120694, filed on Dec. 7, 2009 with the Korean Intellectual Property Office, the entire disclosure of which is incorporated herein by reference.

BACKGROUND

1. Field

Example embodiments of the present invention relate to an actuator, a stage device, and an exposure apparatus for use in relatively high precision motion equipment.

2. Description of the Related Art

A conventional actuator may use drive devices equal in number to the desired degrees of freedom in order to realize an apparatus that may be driven independently in all directions. However, such an actuator may have a more complex configuration and increased overall size, thus limiting freedom in design of the surrounding system.

SUMMARY

An actuator according to example embodiments may be relatively compact so as to overcome conventional spatial constraints and may be driven with 2 degrees of freedom. A stage device according to example embodiments may be driven with 5 degrees of freedom using a combination of the actuators. An exposure apparatus may use the stage device according to example embodiments to correct the precision of a multi-optical system.

An actuator according to example embodiments may include a base member, a ball screw member including a ball screw coupled to the base member and a ball nut screwed onto the ball screw, a driving member coupled to the ball nut so as to move in conjunction with the ball nut, a first directional displacement member configured to move in a first direction in response to a first movement of the driving member, a wedge member coupled to the driving member so as to move in a second direction in response to a second movement of the driving member, a second directional displacement member configured to move in a second direction in conjunction with the wedge member, and a binding member configured to bind the first directional displacement member to at least one of the driving member, the wedge member, and the base member.

The first directional displacement member may include a frame portion arranged inside the base member, a first directional displacement portion arranged outside the base member and taking the form of a plate, and a connection portion connecting the frame portion and the first directional displacement portion to each other. The second directional displacement member may include a supporting portion accommodated in the base member so as to be coupled to the wedge member, and a second directional displacement portion taking the form of a plate supported by the supporting portion. The wedge member may include a slope declining in the first direction toward the first directional displacement portion.

The binding member may include a first binding member to bind the first directional displacement member and the driving member to each other to prevent relative displacement between the driving member and the wedge member. The binding member may also include a second binding member to bind the first directional displacement member and the wedge member to each other to prevent relative displacement between the driving member and the wedge member. The binding member may further include a third binding member to bind the first directional displacement member and the base member to each other to restrict relative displacement between the first directional displacement member and the base member in the first direction.

The actuator may also include a first linear guide member including a first rail fixed to the slope and a first block fixed to the driving member, the first block being slidably coupled to the first rail. The actuator may additionally include a second linear guide member installed between the driving member and the frame portion to guide a relative movement between the driving member and the first directional displacement member. The actuator may further include third and fourth linear guide members installed respectively between both sides of the base member and the frame portion to guide a relative movement between the base member and the frame portion. The actuator may further include fifth and sixth linear guide members installed respectively between both sides of the wedge member and the frame portion to guide a relative movement between the wedge member and the frame portion. The actuator may further include a seventh linear guide member installed between the supporting portion and the wedge member to guide a relative movement between the second directional displacement member and the wedge member. The actuator may further include eighth and ninth linear guide members installed between the base member and the supporting portion to guide a relative movement between the base member and the second directional displacement member.

A stage device according to example embodiments may include an outer case, an inner case inside the outer case, a plurality of actuators coupled to the inner case and configured to allow the inner case to move relative to the outer case, and stages coupled to the plurality of actuators and configure to perform rotational and tilting motions relative to the outer case, wherein each of the actuators includes a base member installed to the inner case, a ball screw member including a ball screw coupled to the base member and a ball nut screwed to the ball screw, a driving member coupled to the ball nut so as to be moved along with the ball nut, a first directional displacement member coupled to the outer case so as to be moved in a first direction in linkage with the driving member, a wedge member coupled to the driving member so as to be moved in a second direction in linkage with the driving member, a second directional displacement member coupled to the stages so as to be moved in the second direction in linkage with the wedge member, and a binding member to bind the first directional displacement member to at least one of the driving member, the wedge member, and the base member.

The plurality of actuators may include two first actuators, each having the base member fixed to a bottom wall and a corresponding sidewall of the inner case and the first directional displacement member coming into close contact with the outer case, and a second actuator spaced apart from the first actuators and having the base member fixed to the bottom wall of the inner case. The stages may include a tilting stage coupled to the second directional displacement members of the first and second actuators via flexible hinges, and a rotation stage coupled to the tilting stage with a bearing interposed therebetween and connected to the first directional displacement member of the second actuator. The rotation stage may have 5 degrees of freedom according to selective driving of the first and second directional displacement members of the first and second actuators.

An exposure apparatus according to example embodiments may include a light source, a Digital Micro-mirror Device (DMD) module configured to produce an image pattern via On/Off modulation of a beam emitted from the light source using a plurality of DMDs, a first optical system and a second optical system configured to transmit the image pattern On/Off modulated by the DMD module, and a stage device installed outside the exposure apparatus for posture control of a multi-optical system including of the first optical system and the second optical system, wherein the stage device includes an outer case, an inner case provided inside the outer case, a plurality of actuators coupled to the inner case to allow the inner case to be moved relative to the outer case, and a stage coupled to the actuators and adapted to perform rotational and tilting motions relative to the outer case, and wherein each of the actuators includes a base member installed to the inner case, a ball screw member including a ball screw coupled to the base member and a ball nut screwed to the ball screw, a driving member coupled to the ball nut so as to be moved along with the ball nut, a first directional displacement member coupled to the outer case so as to be moved in a first direction in linkage with the driving member, a wedge member coupled to the driving member so as to be moved in a second direction in linkage with the driving member, a second directional displacement member coupled to the stage so as to be moved in the second direction in linkage with the wedge member, and a binding member to bind the first directional displacement member to at least one of the driving member, the wedge member, and the base member.

BRIEF DESCRIPTION OF THE DRAWINGS

The above and/or other aspects of example embodiments of the invention may become more apparent and readily appreciated when the following description is taken in conjunction with the accompanying drawings of which.

DETAILED DESCRIPTION

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 1:
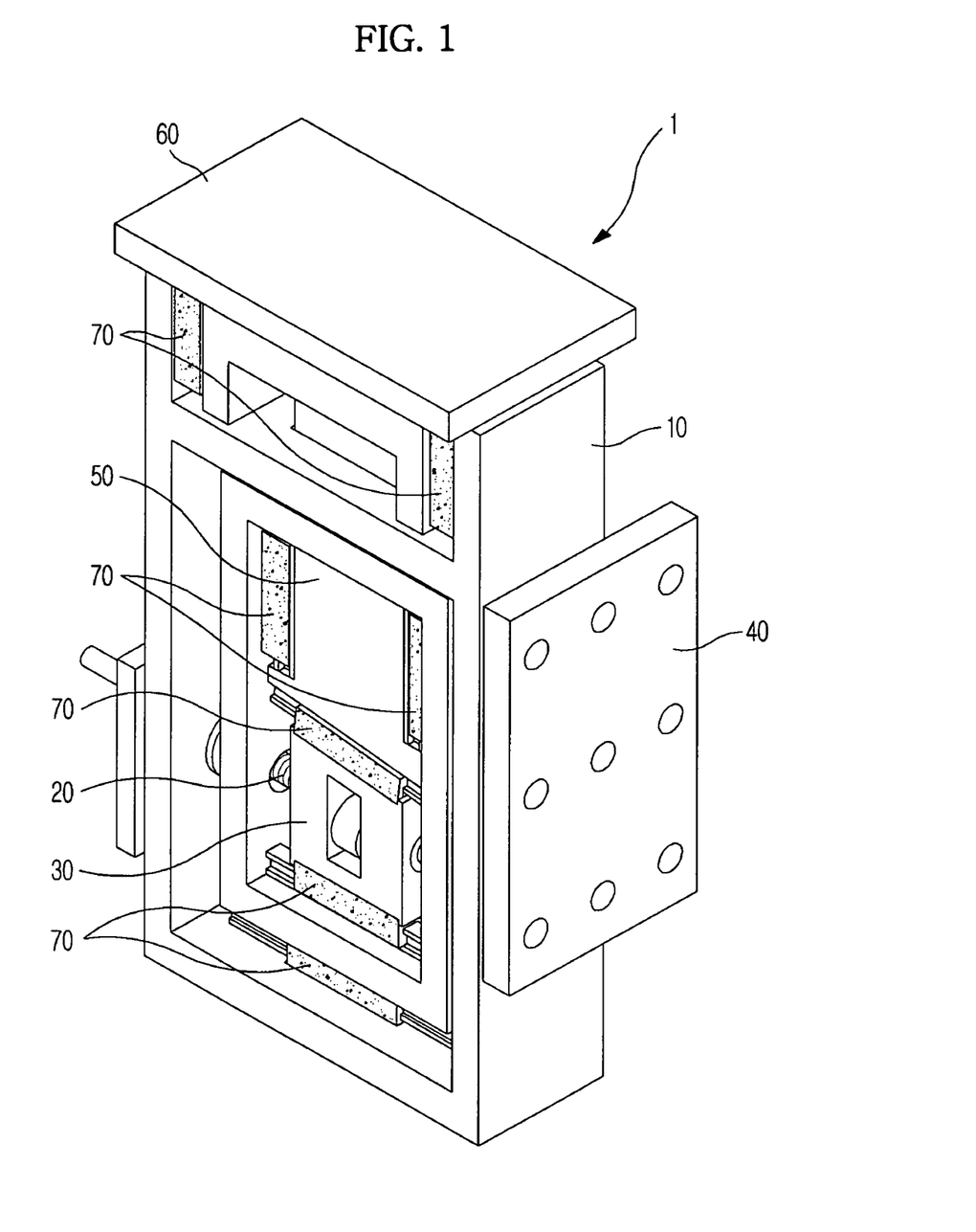
FIG. 1 is a perspective view illustrating an actuator according to a non-limiting embodiment of the present invention.
Figure 2:
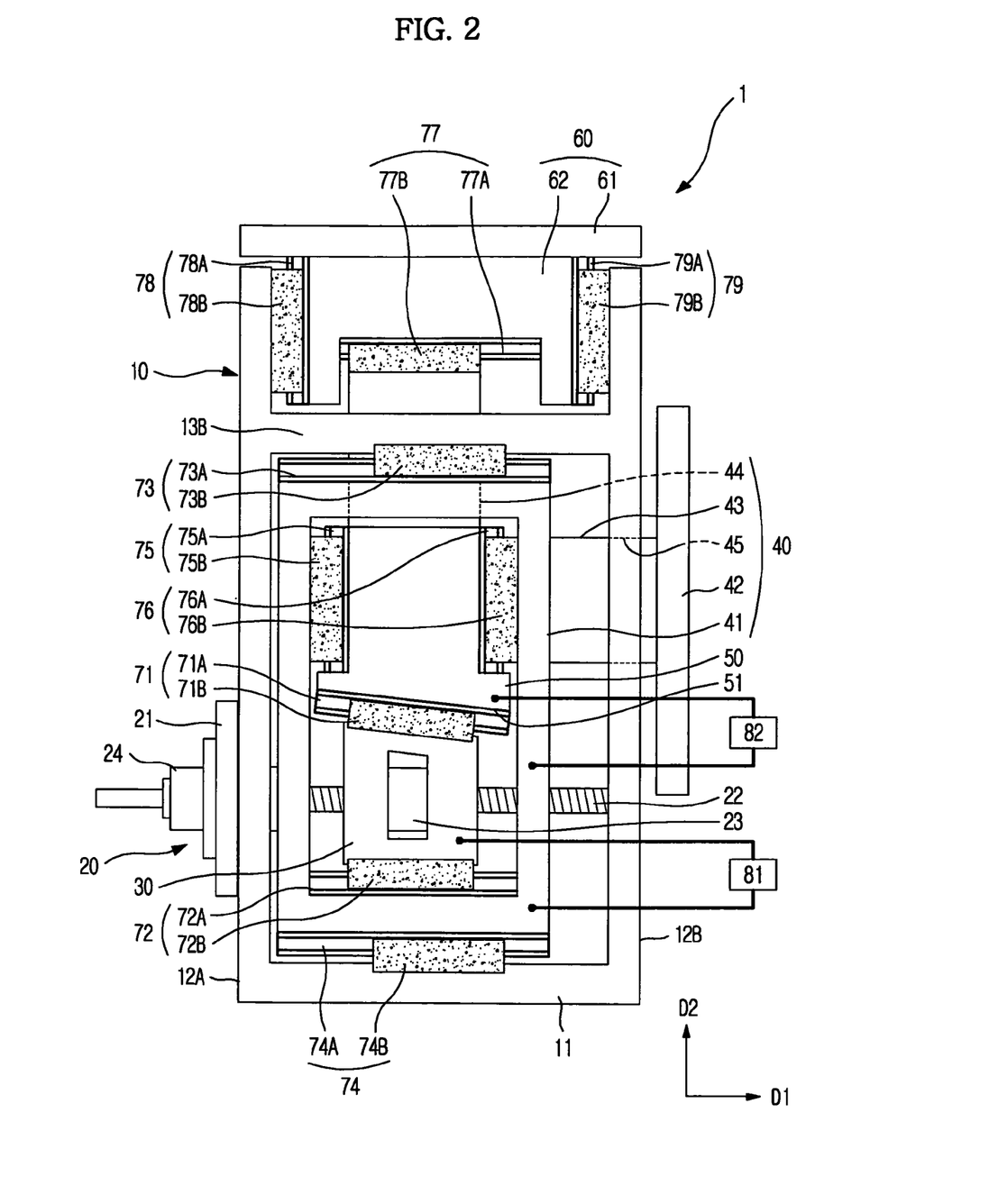
FIGS. 2 and 3 are sectional views illustrating a first directional displacement of the actuator illustrated in FIG. 1.
Figure 3:
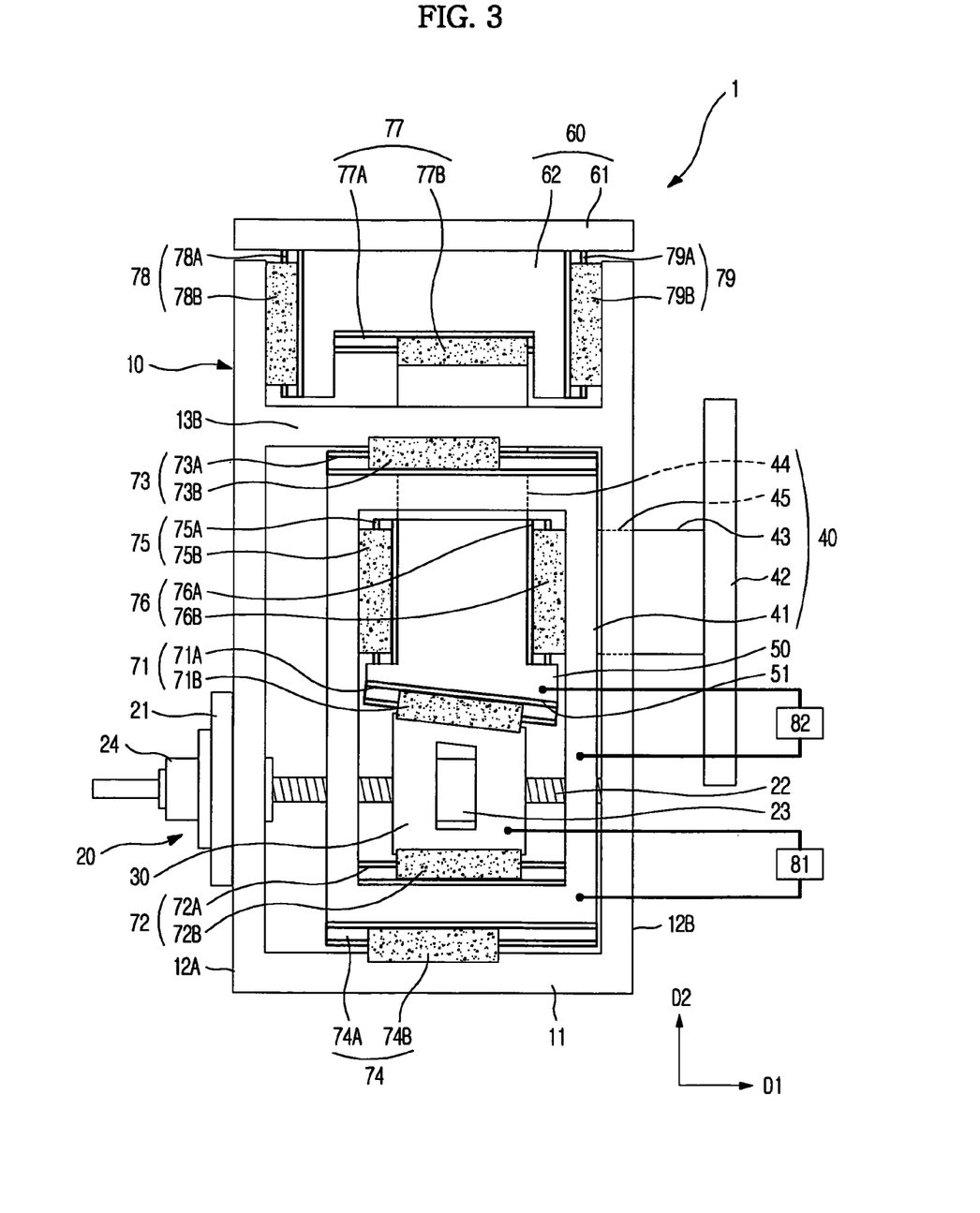
Figure 4:
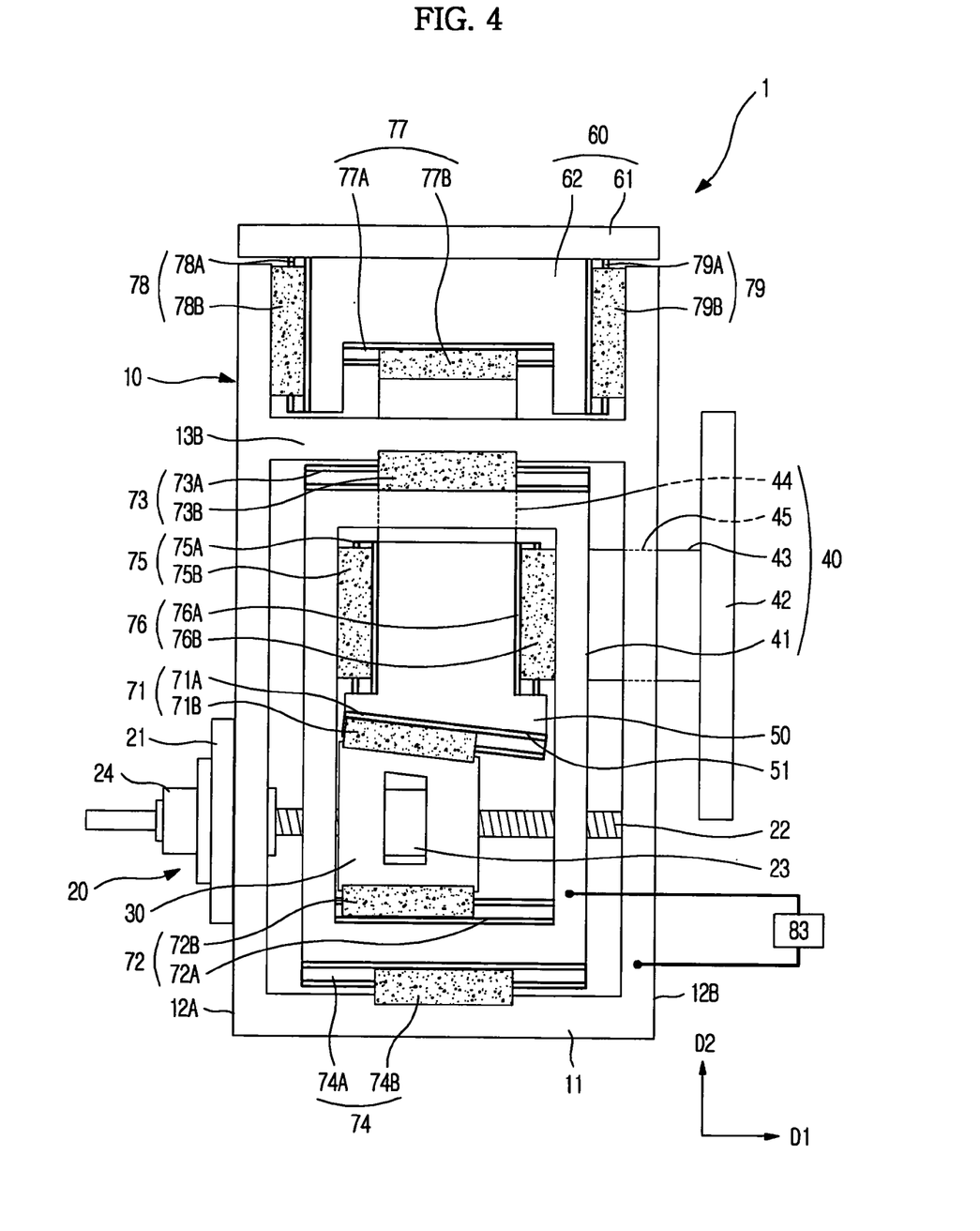
FIGS. 4 and 5 are sectional views illustrating a second directional displacement of the actuator illustrated in FIG. 1.
Figure 5:
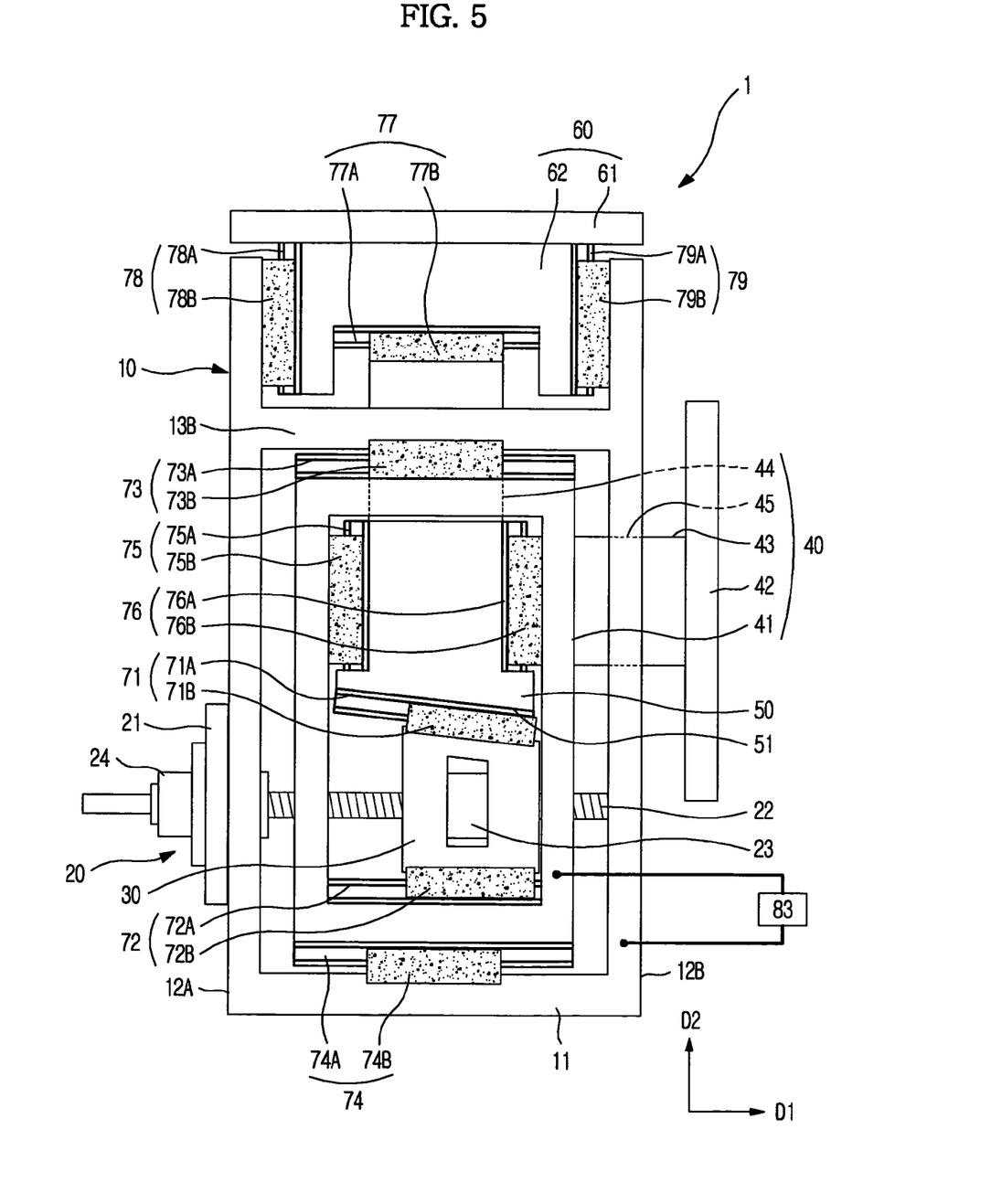

FIG. 1 is a perspective view illustrating an actuator according to a non-limiting embodiment of the present invention. FIGS. 2 and 3 are sectional views illustrating a first directional displacement of the actuator illustrated in FIG. 1. FIGS. 4 and 5 are sectional views illustrating a second directional displacement of the actuator illustrated in FIG. 1.

As illustrated in FIGS. 1 to 5, the actuator 1 may include a base member 10, a ball screw member 20, a driving member 30, a first directional displacement member 40, a wedge member 50, a second directional displacement member 60, and a plurality of linear guide members 70.

The base member 10 is a framework to which the ball screw member 20, the driving member 30, the first directional displacement member 40, the wedge member 50, and the second directional displacement member 60 may be mounted. The base member 10 includes a bottom wall 11, first and second sidewalls 12A and 12B, respectively, extending upward from both sides of the bottom wall 11, and an intermediate wall 13B arranged facing the bottom wall 11 between the first and second sidewalls 12A and 12B.

The ball screw member 20 may be arranged in a space defined between the bottom wall 11 and the intermediate wall 13B of the base member 10. The ball screw member 20 includes a fixed portion 21 immovably fixed to the first sidewall 12A, a ball screw 22 extending from the fixed portion 21 and fastened to the first and second sidewalls 12A and 12B, and a ball nut 23 screwed onto the ball screw 22. The driving member 30 may be coupled to the ball nut 23 to receive the drive power of the ball screw member 20.

The driving member 30 may perform a linear motion in a first direction D1 via the rotational motion of the ball screw 22. As a result, the driving member 30 may be coupled to first and second linear guide members 71 and 72, which may be arranged substantially parallel to the ball screw 22 of the ball screw member 20. The driving member 30 is allowed to perform only linear motion rather than being rotated along with the ball screw 22.

The first linear guide member 71 may be arranged above the driving member 30, and the second linear guide member 72 may be arranged below the driving member 30. The first and second linear guide members 71 and 72 respectively include first and second rails 71A and 72A and first and second blocks 71B and 72B slidably coupled to the first and second rails 71A and 72A. The first and second blocks 71B and 72B may be fixed respectively to upper and lower ends of the driving member 30.

The first and second rails 71A and 72A may be fixed to the wedge member 50 and the first directional displacement member 40, respectively, which will be described hereinafter in further detail. With this configuration, the first and second linear guide members 71 and 72 allow the driving member 30 to perform only a linear motion in the first direction D1 rather than being rotated along with the ball screw 22.

The first directional displacement member 40 may be located inside and outside the base member 10 and may be displaced in the first direction D1 by the driving member 30. The first directional displacement member 40 may be displaced in the first direction D1 when the driving member 30 is moved in the first direction D1. The first directional displacement member 40 includes a frame portion 41 located inside the base member 10, the frame portion 41 taking the form of a box having a predetermined space, a first directional displacement portion 42 located outside the base member 10, and a connection portion 43 connecting the frame portion 41 and the first directional displacement portion 42 to each other.

The frame portion 41 accommodates the driving member 30 in the predetermined space thereof. The frame portion 41 may also accommodate the wedge member 50, which will be described hereinafter in further detail. The frame portion 41 has a first perforation 44 so that the wedge member 50 accommodated in the frame portion 41 may be coupled to the second directional displacement member 60. The connection portion 43 extends from the frame portion 41 in the first direction D1 and penetrates through a second perforation 45 formed in the second sidewall 12B. As a result, the connection portion 43 is located both inside and outside the base member 10. The first directional displacement portion 42 is coupled to the connection portion 43 so as to be located outside the base member 10. The first directional displacement portion 42 may take the form of a plate and may act to displace an object arranged external to the actuator 1 in the first direction D1.

Third and fourth linear guide members 73 and 74 may be arranged above and below the frame portion 41 of the first directional displacement member 40 to guide the movement of the first directional displacement member 40. The third linear guide member 73 includes a third rail 73A fixed to an upper end of the frame portion 41 and a third block 73B fixed to a lower surface of the intermediate wall 13B of the base member 10, the third block 73B being slidably coupled to the third rail 73A. The fourth linear guide member 74 includes a fourth rail 74A fixed to a lower end of the frame portion 41 and a fourth block 74B fixed to an upper surface of the bottom wall 11 of the base member 10, the fourth block 74B being slidably coupled to the fourth rail 74A.

The second directional displacement member 60 is mounted to the base member 10 and is displaced in a second direction D2 by the driving member 30. The second directional displacement member 60 may be coupled to the driving member 30 via the wedge member 50. The wedge member 50 serves to convert drive power of the driving member 30 in the first direction D1 into drive power thereof in the second direction D2. The wedge member 50 may include a slope 51 declined in the first direction D1 in the movement direction of the driving member 30. However, it should be understood that the slope 51 may also be declined in the opposite direction (e.g., negative D1 direction).

The first rail 71A of the first linear guide member 71 may be fixed to the slope 51 of the wedge member 50. Also, the first block 71B of the first linear guide member 71 is fixed to the upper end of the driving member 30. The wedge member 50 is adapted to be moved in the second direction D2 as the driving member 30 is moved in the first direction D1.

A fifth linear guide member 75 and a sixth linear guide member 76 may be arranged at both sides of the wedge member 50 to guide the movement of the wedge member 50 in the second direction D2. The fifth linear guide member 75 includes a fifth rail 75A fixed to one side of the wedge member 50 and a fifth block 75B fixed to one side of the frame portion 41 of the first directional displacement member 40, the fifth block 75B being slidably coupled to the fifth rail 75A. The sixth linear guide member 76 includes a sixth rail 76A fixed to the other side of the wedge member 50 and a sixth block 76B fixed to the other side of the frame portion 41 of the first directional displacement member 40, the sixth block 76B being slidably coupled to the sixth rail 76A.

The wedge member 50 is coupled to the second directional displacement member 60. As a result, the wedge member 50 may penetrate through the first perforation 44 of the first directional displacement member 40 and a perforation (not shown) of the intermediate wall 13B of the base member 10. The second directional displacement member 60 may include a second directional displacement portion 61 in the form of a plate, and a supporting portion 62 accommodated in the base member 10 to support the second directional displacement portion 61. The second directional displacement member 60 may be coupled to the wedge member 50 via a seventh linear guide member 77. The seventh linear guide member 77 includes a seventh rail 77A fixed to a lower surface of the supporting portion 62 and a seventh block 77B fixed to an upper surface of the wedge member 50, the seventh block 77B being slidably coupled to the seventh rail 77A.

An eighth linear guide member 78 and a ninth linear guide member 79 may be arranged at both sides of the supporting portion 62 to guide movement of the second directional displacement member 60 in the second direction D2. The eighth linear guide member 78 includes an eighth rail 78A fixed to a left side of the supporting portion 62 and an eighth block 78B fixed to the first sidewall 12A, the eighth block 78B being slidably coupled to the eighth rail 78A. The ninth linear guide member 79 includes a ninth rail 79A fixed to a right side of the supporting portion 62 and a ninth block 79B fixed to the second sidewall 12B, the ninth block 79B being slidably coupled to the ninth rail 79A. With this configuration, the second directional displacement portion 61 in the form of a plate may act to displace an object arranged external to the actuator 1 in the second direction D2.

Binding members 80 may be used respectively to bind the first directional displacement member 40 and at least one of the driving member 30, the wedge member 50, and the base member 10 to each other. The binding members 80 may include first to third binding members 81, 82 and 83. The first binding member 81 may be used to bind the driving member 30 and the first directional displacement member 40 to each other to restrict relative displacement between the driving member 30 and the wedge member 50. The second binding member 82 may be used to bind the wedge member 50 and the first directional displacement member 40 to each other to restrict relative displacement between the driving member 30 and the wedge member 50. The third binding member 83 may be used to bind the base member 10 and the first directional displacement member 40 to each other to restrict relative displacement between the first directional displacement member 40 and the base member 10 in the first direction D1. Assuming that the first direction D1 is an X-axis direction, the second direction D2 may be any one of a Y-axis direction and a Z-axis direction.

Hereinafter, the operation of the actuator 1 will be described with reference to FIGS. 2 to 5. First, the operation of the first directional displacement member 40 will be described with reference to FIGS. 2 and 3. As illustrated in FIGS. 2 and 3, if the ball screw 22 is rotated by a drive source 24, the rotational motion of the ball screw 22 is converted into linear motion of the ball nut 23. As a result, the driving member 30 will also be linearly moved in the first direction D1 simultaneously with the linear motion of the ball nut 23.

When drive power of the drive source 24 is transmitted to the driving member 30, the drive power will be transmitted only to the first directional displacement member 40 (rather than also being transmitted to the second directional displacement member 60 via the wedge member 50) if there is no relative displacement between the driving member 30 and the wedge member 50. Accordingly, the first directional displacement member 40 may be moved in the first direction D1 by the driving member 30, thus generating a first directional displacement of the actuator 1.

To assure transmission of the drive power from the driving member 30 to the first directional displacement member 40 without relative displacement between the driving member 30 and the wedge member 50, the driving member 30 and the first directional displacement member 40 (and/or the wedge member 50 and the first directional displacement member 40) may be bound to each other via the first binding member 81 (and/or the second binding member 82). The binding members 80 may include, e.g., a pneumatic clamper (not shown) or a magnet brake (not shown) to bind the driving member 30 (and/or the wedge member 50) and the first directional displacement member 40 to each other.

Next, the operation of the second directional displacement member 60 will be described with reference to FIGS. 4 and 5. As illustrated in FIGS. 4 and 5, if the ball screw 22 is rotated by a drive source 24, the rotational motion of the ball screw 22 is converted into linear motion of the ball nut 23 in the first direction D1. As a result, the driving member 30 will be linearly moved in the first direction D1 simultaneously with the linear motion of the ball nut 23. If the relative displacement between the first directional displacement member 40 and the base member 10 in the first direction D1 is restricted when drive power of the drive source 24 is transmitted to the driving member 30, then the second directional displacement member 60 will be driven in the second direction D2 as the wedge member 50 is moved in the second direction D2. Accordingly, the second directional displacement member 60 is moved in the second direction D2 by the driving member 30, thereby generating the second directional displacement of the actuator 1. To restrict the relative displacement of the wedge member 50 in the first direction D1, the base member 10 and the first directional displacement member 40 may be bound to each other via the third binding member 83.

Figure 6:
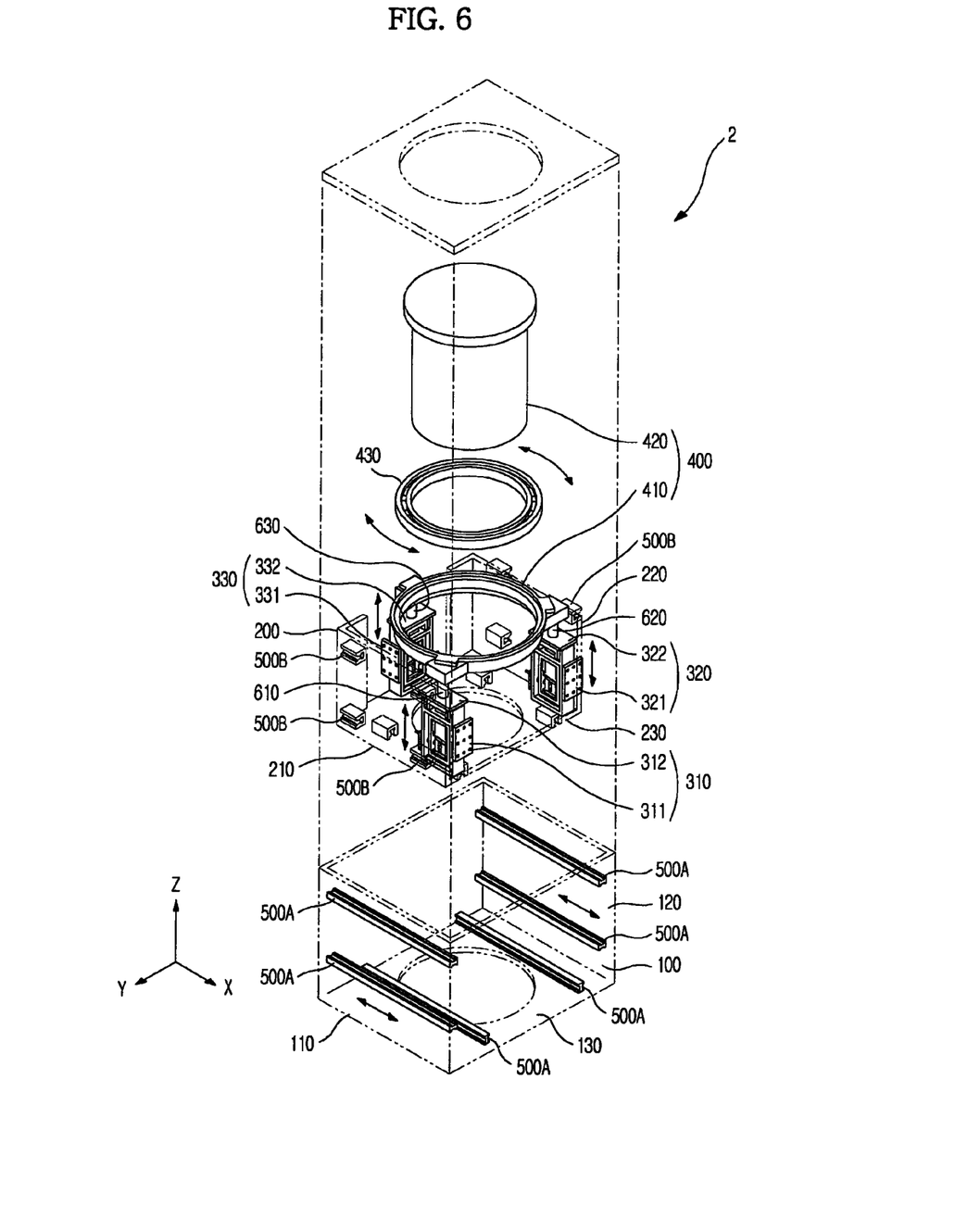
FIG. 6 is an exploded perspective view of a stage device according to a non-limiting embodiment of the present invention.
Figure 7:
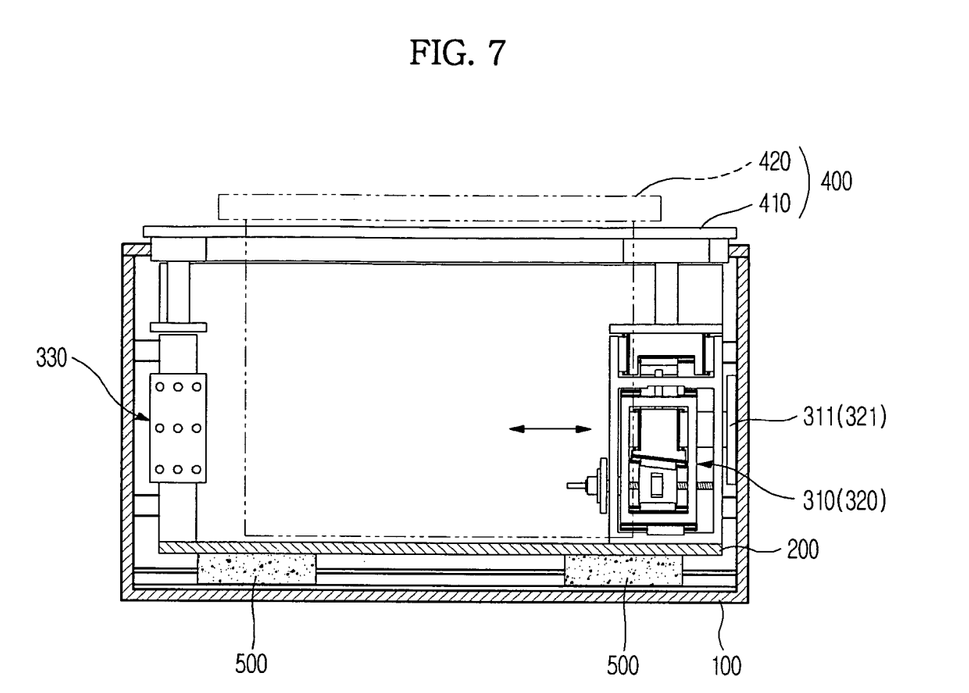
FIGS. 7 and 8 are side sectional views illustrating the stage device illustrated in FIG. 6.
Figure 8:
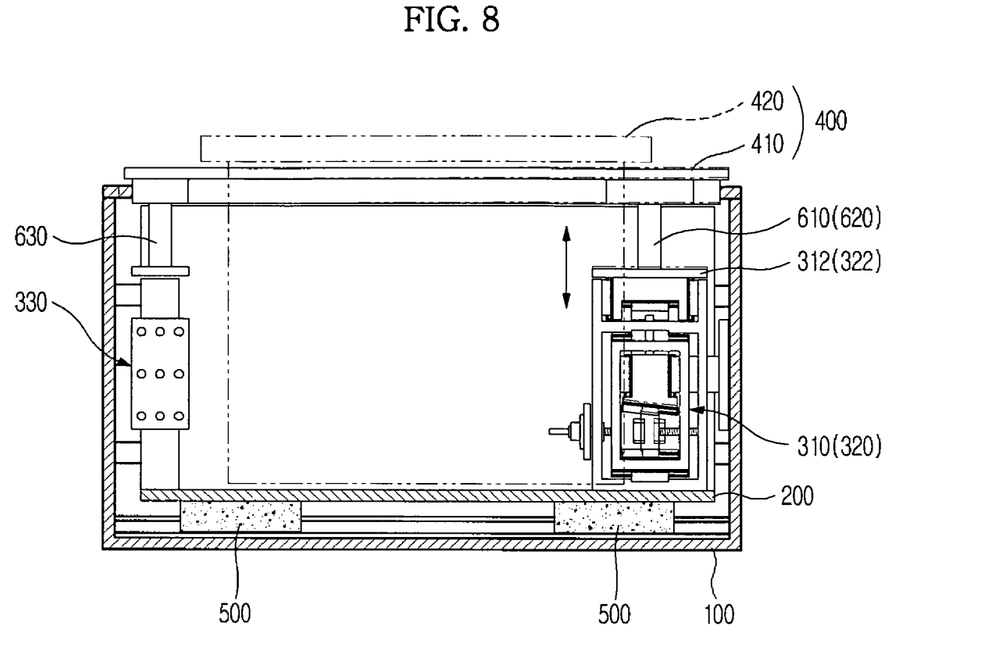
Figure 9:
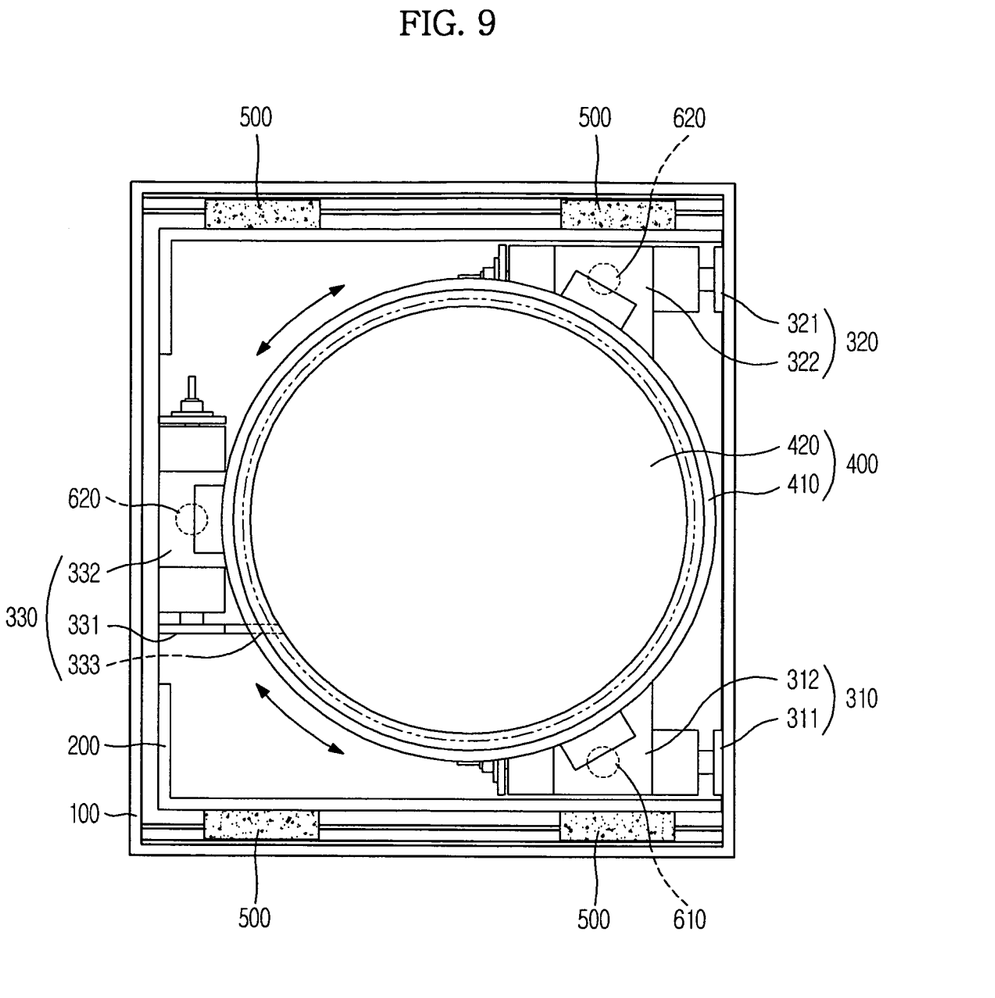
FIG. 9 is a plan view illustrating the stage device illustrated in FIG. 6.

Hereinafter, a stage device according to a non-limiting embodiment of the present invention will be described with reference to FIGS. 6 to 8. FIG. 6 is an exploded perspective view of a stage device according to a non-limiting embodiment of the present invention. FIGS. 7 and 8 are side sectional views illustrating the stage device illustrated in FIG. 6. FIG. 9 is a plan view illustrating the stage device illustrated in FIG. 6.

As illustrated in FIGS. 6 to 9, the stage device 2 may include an outer case 100, an inner case 200 arranged inside the outer case 100, a plurality of actuators 310 to 330 installed to the inner case 200 to allow the inner case 200 to be moved relative to the outer case 100, and stages 400 coupled to the inner case 200 and the actuators 310 to 330 to perform a tilting or rotational motion. Each of the plurality of actuators 310 to 330 may be as described above in connection with FIGS. 1 to 5, although example embodiments are not limited thereto. The stage device 2 may further include linear guides 500 to enable a tilting or rotational motion of the respective stages 400. The stages 400 may include a tilting stage 410 and a rotation stage 420 coupled to any one of the actuators, e.g., the actuator 330 to perform a rotational motion. The outer case 100 has a box shape and accommodates the inner case 200, the linear guides 500, the actuators 310 to 330, the tilting stage 410, and the rotation stage 420 therein. The inner case 200, the actuators 310 to 330, the tilting stage 410, and the rotation stage 420 are movable relative to the outer case 100.

The plurality of linear guides 500 are coupled to the outer case 100. The plurality of linear guides 500 may include two pairs of upper and lower guides attached to the left and right sidewalls 110 and 120 of the outer case 100 and a pair of left and right guides attached to a bottom wall 130 of the outer case 100. Each of the plurality of linear guides 500 includes a rail member 500A fixed to the outer case 100 and a block member 500B slidably coupled to the rail member 500A. The block member 500B may be fixed to the inner case 200 to allow the inner case 200 to be movable relative to the outer case 100. The inner case 200 includes a bottom wall 210 and both sidewalls 220 and 230 extending upward from both sides of the bottom wall 210. The inner case 200 may be driven by the plurality of actuators 310 and 330 fixed to both the sidewalls 220 and 230 and the bottom wall 210 of the inner case 200.

The actuators 310 to 330 include first actuators 310 and 320 fixed on the bottom wall 210 at front ends of both the sidewalls 220 and 230 of the inner case 200, and a second actuator 330 fixed on the bottom wall 210 at a center position between rear ends of both the sidewalls 220 and 230 of the inner case 200. The first actuators 310 and 320 may be referred to as a first-A actuator 310 fixed to the front end of the left sidewall 220 of the inner case 200, and a first-B actuator 320 fixed to the front end of the right sidewall 230 of the inner case 200.

The first-A actuator 310 may include an X-axis first displacement member 311 aligned in an X-axis direction and a Z-axis first displacement member 312 aligned in a Z-axis direction. The X-axis first displacement member 311 may be fixed to the outer case 100, and the Z-axis first displacement member 312 may be coupled to the tilting stage 410 via a first flexible hinge 610. The first-B actuator 320 may include an X-axis second displacement member 321 aligned in an X-axis direction and a Z-axis second displacement member 322 aligned in a Z-axis direction. The X-axis second displacement member 321 may be fixed to the outer case 100, and the Z-axis second displacement member 322 may be coupled to the tilting stage 410 via a second flexible hinge 620.

The second actuator 330 may include a rotation displacement member 331 coupled to the rotation stage 420, which will be described hereinafter in further detail, and a Z-axis third displacement member 332 coupled to the tilting stage 410 via a third flexible hinge 630. The tilting stage 410 may be coupled to the Z-axis first displacement member 312, the Z-axis second displacement member 322, and the Z-axis third displacement member 332 via the first to third flexible hinges 610 to 630. A bearing 430 may be coupled inside the tilting stage 410. The tilting stage 410 may be coupled to the rotation stage 420 via the bearing 430.

Hereinafter, operation of the stage device 2 according to a non-limiting embodiment of the present invention will be described with reference to FIGS. 7 and 8. If the X-axis first displacement member 311 of the first-A actuator 310 and the X-axis second displacement member 321 of the first-B actuator 320 are displaced relative to the outer case 100 in a positive X-axis direction (or a negative X-axis direction), the inner case 200 coupled to the first-A actuator 310 and the first-B actuator 320 will be displaced relative to the outer case 100 in the positive X-axis direction (or the negative X-axis direction). Accordingly, the stage device 2 has a freedom of translational motion in an X-axis direction by virtue of the first-A actuator 310 and the first-B actuator 320.

If the Z-axis first displacement member 312 of the first-A actuator 310, the Z-axis second displacement member 322 of the first-B actuator 320, and the Z-axis third displacement member 332 of the second actuator 330 are displaced relative to the outer case 100 in a positive Z-axis direction (or a negative Z-axis direction), the inner case 200 coupled to the first-A actuator 310, the first-B actuator 320, and the second actuator 330 via the first to third flexible hinges 610 to 630 will be displaced relative to the outer case 100 in the positive Z-axis direction (or the negative Z-axis direction). Accordingly, the stage device 2 has a freedom of translational motion in a Z-axis direction by virtue of the first-A actuator 310, the first-B actuator 320, and the second actuator 330.

Also, if one or two of the Z-axis first displacement member 312 of the first-A actuator 310, the Z-axis second displacement member 322 of the first-B actuator 320, and the Z-axis third displacement member 332 of the second actuator 330 are selectively displaced relative to the outer case 100 in a positive Z-axis direction (or a negative Z-axis direction), the inner case 200 coupled to the first-A actuator 310, the first-B actuator 320, and the second actuator 330 via the first to third flexible hinges 610 to 630 may be rotated relative to the outer case 100 in an X-Y plane. Accordingly, the stage device 2 has a freedom of rotation in $X_R$ and $Y_R$ directions by virtue of the first-A actuator 310, the first-B actuator 320, and the second actuator 330.

The rotation stage 420, as illustrated in FIG. 9, may be coupled to the rotation displacement member 331 of the second actuator 330 via a connection member 333. Accordingly, the rotation stage 420 has a freedom of rotation in a $Z_R$ direction by virtue of the rotation displacement member 331 of the second actuator 330. Thus, the stage device 2 may be realized as a relatively high precision stage device with 5 degrees of freedom.

Figure 10:
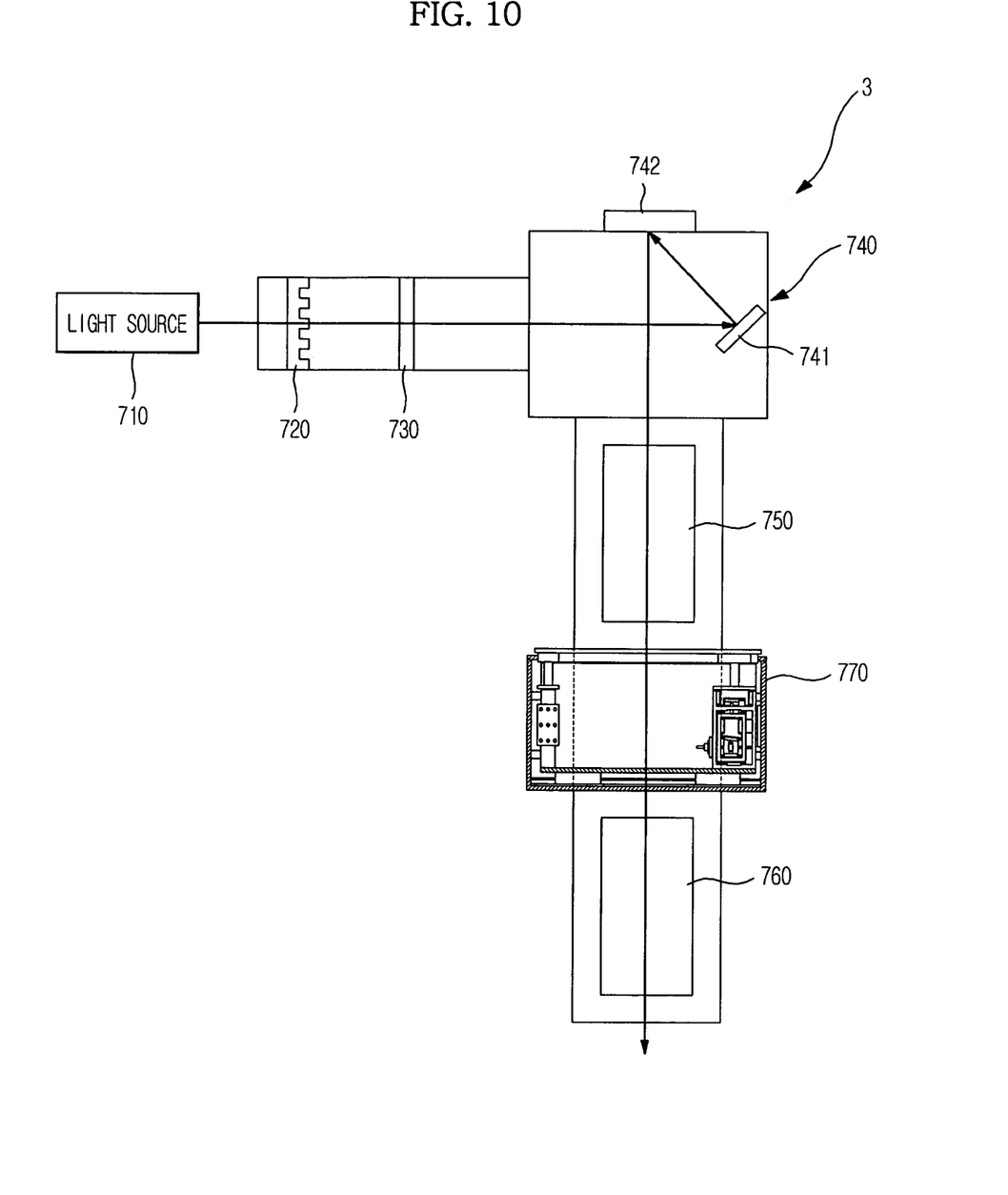
FIG. 10 is a schematic view illustrating a mask-less exposure apparatus according to a non-limiting embodiment of the present invention.

Hereinafter, a mask-less exposure apparatus according to a non-limiting embodiment of the present invention will be described with reference to FIG. 10. FIG. 10 is a schematic view illustrating a mask-less exposure apparatus according to a non-limiting embodiment of the present invention. As illustrated in FIG. 10, the mask-less exposure apparatus 3 may include a light source 710, a diffraction optical device 720, a transmission lens 730, a Digital Micro-mirror Device (DMD) module 740, a first optical system 750, a second optical system 760, and a stage device 770. The stage device 770 may be as described above in connection with FIGS. 6 to 9, although example embodiments are not limited thereto.

A beam emitted from the light source 710 may be converted into a circular beam having spots via the diffraction optical device 720 and the transmission lens 730. Specifically, the diffraction optical device 720 generates diffracted light, and the transmission lens 730 generates diffracted spots in a specific array at a focal distance thereof. The circular beam generated by the diffraction optical device 720 and the transmission lens 730 may be introduced into the DMD module 740. The DMD module 740 generates a single image pattern from the beam via On/Off modulation of micro-mirrors 741 and 742 thereof.

After the beam introduced into the DMD module 740 undergoes On/Off modulation, the beam (or an image) is transmitted to a substrate (not shown) by way of the first optical system 750 and the second optical system 760. In particular, the beam passes through the first optical system 750 and the second optical system 760 prior to being transmitted to the substrate. The stage device 770 may be installed to adjust the direction of the beam to be introduced into the substrate. An optical system may penetrate through an opening of the rotation stage 420 (e.g., rotation stage 420 illustrated in FIG. 9). The stage device 770 may be installed outside the optical system (which may include the first and second optical systems 750 and 760) to adjust the direction of the beam that has passed through the DMD module 740, thereby allowing the beam to reach a specific beam formation position on the substrate (not shown).

As discussed above, an actuator according to a non-limiting embodiment of the present invention may be driven with two degrees of freedom and may have a reduced size to overcome spatial constraints. Furthermore, a stage device according to a non-limiting embodiment of the present invention may be driven with 5 degrees of freedom according to a combination of the actuators. With the use of the actuator and the stage device, an exposure apparatus according to a non-limiting embodiment of the present invention may be achieved to correct the precision of multiple optical systems.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. An actuator comprising:
a base member;
a ball screw member including a ball screw coupled to the base member and a ball nut screwed onto the ball screw;
a driving member coupled to the ball nut so as to move in conjunction with the ball nut;
a first directional displacement member configured to move in a first direction in response to a first movement of the driving member;
a wedge member coupled to the driving member so as to move in a second direction in response to a second movement of the driving member;
the second directional displacement member configured to move in a second direction in conjunction with the wedge member; and
a binding member configured to bind the first directional displacement member to at least one of the driving member, the wedge member, and the base member.

2. The actuator according to claim 1, wherein the first directional displacement member includes a frame portion arranged inside the base member, a first directional displacement portion arranged outside the base member and in the form of a plate, and a connection portion connecting the frame portion and the first directional displacement portion.

3. The actuator according to claim 1, wherein the second directional displacement member includes a supporting portion disposed in the base member so as to be coupled to the wedge member, and a second directional displacement portion in the form of a plate that is supported by the supporting portion.

4. The actuator according to claim 1, wherein the wedge member includes a slope declining in the first direction toward the first directional displacement portion.

5. The actuator according to claim 4, further comprising:
a first linear guide member including a first rail secured to the slope and a first block secured to the driving member, the first block being slidably coupled to the first rail.

6. The actuator according to claim 1, wherein the binding member includes a first binding member configured to bind the first directional displacement member and the driving member so as to restrict a relative displacement between the first directional displacement member and the driving member.

7. The actuator according to claim 1, wherein the binding member includes a second binding member configured to bind the first directional displacement member and the wedge member so as to restrict a relative displacement between the first directional displacement member and the wedge member.

8. The actuator according to claim 1, wherein the binding member includes a third binding member configured to bind the first directional displacement member and the base member so as to restrict a relative displacement between the first directional displacement member and the base member.

9. The actuator according to claim 2, further comprising:
a second linear guide member between the driving member and the frame portion and configured to guide a relative movement between the driving member and the frame portion.

10. The actuator according to claim 2, further comprising:
third and fourth linear guide members configured to guide a relative movement between the frame portion and the base member, the third linear guide member disposed between a top portion of the frame portion and the base member, and the fourth linear guide member disposed between a bottom portion of the frame portion and the base member.

11. The actuator according to claim 2, further comprising:
fifth and sixth linear guide members configured to guide a relative movement between the wedge member and the frame portion, the fifth and sixth linear guide members disposed between opposing sides of the wedge member and the frame portion.

12. The actuator according to claim 3, further comprising:
a seventh linear guide member configured to guide a relative movement between the wedge member and the second directional displacement member, the seventh linear guide member disposed between the supporting portion and the wedge member.

13. The actuator according to claim 3, further comprising:
eighth and ninth linear guide members configured to guide a relative movement between the second directional displacement member and the base member, the eighth and ninth linear guide members disposed between opposing sides of the supporting portion and the base member.

14. A stage device comprising:
an outer case;
an inner case inside the outer case;
a plurality of actuators coupled to the inner case and configured to allow the inner case to move relative to the outer case; and
stages coupled to the plurality of actuators and configured to perform rotational and tilting motions relative to the outer case,
wherein each of the plurality of actuators is the actuator of claim 1, the base member of each is secured to the inner case, the first directional displacement member of each is coupled to the outer case, and the second directional displacement member of each is coupled to the stages.

15. The stage device according to claim 14, wherein the plurality of actuators include two first actuators and a second actuator, the base member of each of the first actuators being secured to a bottom wall and a corresponding sidewall of the inner case and the first directional displacement member of each being proximal to the outer case, the second actuator spaced apart from the first actuators, and the base member of the second actuator secured to the bottom wall of the inner case.

16. The stage device according to claim 15, wherein the stages include a lilting stage and a rotation stage, the tilting stage coupled to the second directional displacement members of the first and second actuators via flexible hinges, and the rotation stage coupled to the tilting stage with a bearing therebetween and connected to the first directional displacement member of the second actuator.

17. The stage device according to claim 16, wherein the rotation stage is configured to have 5 degrees of freedom according to selective driving of the first and second directional displacement members of the first and second actuators.

18. An exposure apparatus comprising:
a light source;
a digital micro-mirror device (DMD) module configured to produce an image pattern via on/off modulation of a beam emitted from the light source;
a first optical system and a second optical system configured to transmit the image pattern; and the stage device of claim 14 configured for posture control of a multi-optical system including the first optical system and the second optical system.

* * * * *